(12) United States Patent
Yanagisawa et al.

(10) Patent No.: US 8,525,591 B2
(45) Date of Patent: Sep. 3, 2013

(54) SIGNAL LEVEL CONVERSION CIRCUIT, PHYSICAL QUANTITY DETECTION DEVICE AND ELECTRONIC APPARATUS

(75) Inventors: Yoshinao Yanagisawa, Ueda (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 25 days.

(21) Appl. No.: 13/186,859

(22) Filed: Jul. 20, 2011

(65) Prior Publication Data

US 2012/0103093 A1    May 3, 2012

(30) Foreign Application Priority Data

Oct. 27, 2010   (JP) ................. 2010-240736

(51) Int. Cl.
*H03F 3/45*   (2006.01)
(52) U.S. Cl.
USPC ........................................... 330/69; 330/174
(58) Field of Classification Search
USPC ................. 330/69, 150, 174; 327/333
See application file for complete search history.

(56) References Cited

U.S. PATENT DOCUMENTS

| | | | | |
|---|---|---|---|---|
| 3,621,226 | A | * | 11/1971 | Allen .......................... 708/835 |
| 3,792,367 | A | * | 2/1974 | Fleischer et al. .............. 330/98 |
| 6,384,689 | B1 | | 5/2002 | Kimura |
| 2010/0321002 | A1 | * | 12/2010 | Suquet ..................... 324/123 R |

FOREIGN PATENT DOCUMENTS

| | | |
|---|---|---|
| JP | 01-097075 | 4/1989 |
| JP | 07-038354 | 2/1995 |
| JP | 07-046055 | 2/1995 |
| JP | 2001-119250 | 4/2001 |

* cited by examiner

*Primary Examiner* — Steven J Mottola
(74) *Attorney, Agent, or Firm* — Harness, Dickey & Pierce, P.L.C.

(57) ABSTRACT

A signal level conversion circuit 1 includes a first differential amplifier circuit 10 and a second differential amplifier circuit 20. The first differential amplifier circuit 10 multiplies a potential difference between a first input signal and a second input signal by G1 thereby providing an output signal. The second differential amplifier circuit 20 multiplies a potential difference between the output signal of the first differential amplifier circuit 10 and the second input signal by G2 thereby providing an output, where the two gains satisfy the relation of G1×G2<0 and 0<−(G1+1)×G2<2.

7 Claims, 8 Drawing Sheets

SIGNAL LEVEL CONVERSION CIRCUIT, PHYSICAL QUANTITY DETECTION DEVICE AND ELECTRONIC APPARATUS

BACKGROUND

1. Technical Field

The present invention relates to signal level conversion circuits, physical quantity detection devices, and electronic apparatuses.

2. Related Art

A variety of electronic apparatuses and systems that use various types of sensors such as gyro-sensors and acceleration sensors and perform predetermined control based on detected signals provided by the sensors, such as, car-navigation devices and personal navigation devices (PND) are widely used.

Such electronic apparatuses and systems may be configured to amplify a sensor signal with a reference voltage signal in order to match the level of the sensor signal with a signal level required in a set of succeeding stages. For example, JP-A-07-046055 proposes a signal amplifier circuit having amplifiers connected in two stages and capable of independently performing an offset adjustment and a spun adjustment. Also, JP-A-07-038354 proposes a gain switching circuit having amplifiers connected in two stages and capable of amplifying an analog signal with high accuracy.

However, when a sensor signal is amplified with a reference voltage signal, noise that the reference voltage itself has would be superposed on the sensor signal, which makes it difficult to achieve a low-noise implementation.

SUMMARY

In accordance with an advantage of some aspects of the invention, it is possible to provide a signal level conversion circuit that is capable of converting the signal level of a first input signal without amplifying noise superposed on a second input signal, and a physical quantity detection device and an electronic apparatus that use the signal level conversion circuit.

(1) In accordance with an embodiment of the invention, a signal level conversion circuit includes a first differential amplifier circuit that multiplies a potential difference between a first input signal and a second input signal by $G1$ thereby providing an output signal, and a second differential amplifier circuit that multiplies a potential difference between the output signal of the first differential amplifier circuit and the second input signal by $G2$ thereby providing an output signal, where $G1 \times G2 < 0$ and $0 < -(G1+1) \times G2 < 2$.

According to the embodiment described above, the first signal multiplied by $G1 \times G2$ and the second signal multiplied by $\{-(G1+1) \times G2\}$ are superposed on an output signal of the signal level conversion circuit. As $0 < -(G1+1) \times G2 < 2$, when the circuit in the succeeding stage obtains a difference between the output of the signal level conversion circuit in accordance with the present embodiment and the second input signal, a noise component originated from noise superposed on the second input signal can be attenuated to $\{-(G1+1) \times G2 - 1\}$ times its original level.

(2) In the signal level conversion circuit, $G1$ and $G2$ may be $G1 < 0$ and $G2 > 0$, respectively.

As $G1 < 0$, the difference between the first signal and the second signal is inverted and amplified by the first differential amplifier circuit and, as $G2 > 0$, the difference between the output signal of the first differential amplifier circuit and the second signal is non-inverted and amplified. With this configuration, $G1$ and $G2$ that satisfy $0 < -(G1+1) \times G2 < 2$ can be selected.

(3) In the signal level conversion circuit, $G1$ and $G2$ may be $G1 > 0$ and $G2 < 0$, respectively.

As $G1 > 0$, the difference between the first signal and the second signal is non-inverted and amplified by the first differential amplifier circuit and, as $G2 < 0$, the difference between the output signal of the first differential amplifier circuit and the second signal is inverted and amplified. With this configuration, $G1$ and $G2$ that satisfy $0 < -(G1+1) \times G2 < 2$ can be selected.

(4) In the signal level conversion circuit, $G1$ and $G2$ may satisfy $-(G1+1) \times G2 = 1$.

With this configuration, the signal level of the first input signal can be converted without amplifying noise superposed on the second input signal. Accordingly, by obtaining a difference between the output signal of the signal level conversion circuit and the second input signal, noise components originated from noise superposed on the second input signal can be cancelled.

(5) In the signal level conversion circuit, the second input signal may be a reference voltage signal corresponding to a reference voltage of the first input signal.

(6) The signal level conversion circuit may further include a third differential amplifier circuit that amplifies or attenuates a potential difference between the output signal of the second differential amplifier circuit and the second input signal, and outputs the same.

According to the signal level conversion circuit described above, the first signal multiplied by $G1 \times G2$ and the second signal multiplied by $\{-(G1+1) \times G2\}$ are superposed on an output signal of the second differential amplifier circuit. Accordingly, by obtaining a difference between the output signal of the second differential amplifier circuit and the second input signal by the third differential amplifier circuit, a noise component originated from noise superposed on the second input signal can be attenuated to $\{-(G1+1) \times G2 - 1\}$ times its original level. In particular, by selecting $G1$ and $G2$ so as to satisfy $-(G1+1) \times G2 = 1$, noise components originated from noise superposed on the second input signal can be cancelled.

(7) In accordance with another embodiment of the invention, a physical quantity detection device includes any one of the signal level conversion circuits described above, a sensor element that detects a physical quantity, and a physical quantity signal generation section that generates a physical quantity signal having a signal level according to the physical quantity based on a signal generated by the sensor element. The physical quantity signal and a reference voltage signal are supplied to the signal level conversion circuit as the first input signal and the second input signal, respectively.

(8) In accordance with still another embodiment, an electronic apparatus includes any one of the signal level conversion circuits described above.

DESCRIPTION OF EXEMPLARY EMBODIMENTS

Preferred embodiments of the invention will be described in detail below with reference to the accompanying drawings. It is noted that the embodiments described below will not unduly limit the contents of the invention to be described in the scope of patent claims. Further, not all of the configurations described below would necessarily be essential for the invention.

1. Signal Level Conversion Circuit 1-1. First Embodiment

Figure 1:
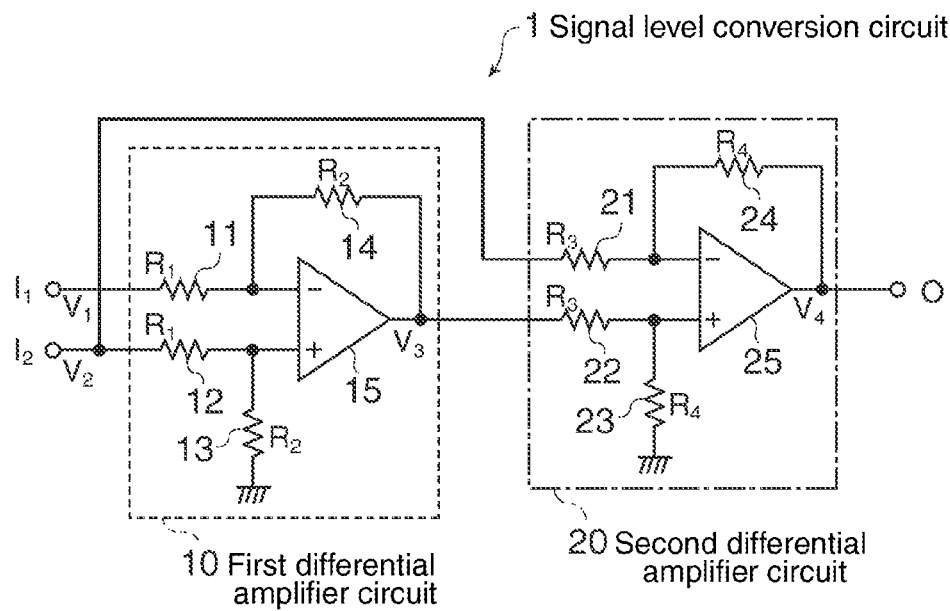
FIG. 1 is a diagram showing a signal level conversion circuit in accordance with a first embodiment of the invention.

FIG. 1 is a diagram showing a signal level conversion circuit in accordance with a first embodiment of the invention. As shown in FIG. 1, a signal level conversion circuit 1 in accordance with the first embodiment is configured with a first differential amplifier circuit 10 and a second differential amplifier circuit 20.

The first differential amplifier circuit 10 is configured with a resistance 11 having a resistance value $R_1$, a resistance 12 having the resistance value $R_1$, a resistance 13 having a resistance value $R_2$, a resistance 14 having the resistance value $R_2$, and a differential amplifier 15.

The resistance 11 has one end connected to an input terminal $I_1$ of the signal level conversion circuit 1, and another end commonly connected to one end of the resistance 14 and an inverting input terminal (− input terminal) of the differential amplifier 15. The other end of the resistance 14 is connected to an output terminal of the differential amplifier 15.

The resistance 12 has one end connected to an input terminal $I_2$ of the signal level conversion circuit 1, and another end commonly connected to one end of the resistance 13 and a non-inverting input terminal (+ input terminal) of the differential amplifier 15. The other end of the resistance 13 is grounded to a ground potential.

When the voltage of a signal (first input signal) inputted in the input terminal $I_1$ is $V_1$, and the voltage of a signal (second input signal) inputted in the input terminal $I_2$ is $V_2$, the voltage of an output signal of the first differential amplifier circuit 10 (an output voltage of the differential amplifier 15) $V_3$ is given by the following formula (1).

Formula 1

$$V_3 = -\frac{R_2}{R_1}(V_1 - V_2) = G1 \times (V_1 - V_2) \tag{1}$$

In the formula (1), $G1=-R_2/R_1$ is a gain of the first differential amplifier circuit 10, and $G1<0$. In other words, the first differential amplifier circuit 10 is a differential amplifier circuit that inverts and amplifies a potential difference ($V_1-V_2$) between the first input signal and the second input signal by G1 (<0) and outputs the same.

The second differential amplifier circuit 20 is configured with a resistance 21 having a resistance value $R_3$, a resistance 22 having the resistance value $R_3$, a resistance 23 having a resistance value $R_4$, a resistance 24 having the resistance value $R_4$, and a differential amplifier 25.

The resistance 21 has one end connected to the input terminal $I_2$ of the signal level conversion circuit 1, and another end commonly connected to one end of the resistance 24 and an inverting input terminal (− input terminal) of the differential amplifier 25. The other end of the resistance 24 is connected to an output terminal of the differential amplifier 25.

The resistance 22 has one end connected to an output terminal of the differential amplifier 15, and another end commonly connected to one end of the resistance 23 and a non-inverting input terminal (+ input terminal) of the differential amplifier 25. The other end of the resistance 23 is grounded to a ground potential.

The voltage of an output signal of the second differential amplifier circuit 20 (an output voltage of the differential amplifier 25) $V_4$ is given by the following formula (2).

Formula 2

$$V_4 = \frac{R_4}{R_3}(V_3 - V_2) = G2 \times (V_3 - V_2) = \tag{2}$$

Here, $G2=R_4/R_3$ is a gain of the second differential amplifier circuit 20, and $G2>0$. In other words, the second differential amplifier circuit 20 is a differential amplifier circuit that non-inverts and amplifies a potential difference ($V_3-V_2$) between the output signal of the first differential amplifier circuit 10 and the second input signal by G2 (>0) and outputs the same.

An output terminal O of the signal level conversion circuit 1 is connected to the output terminal of the differential amplifier 25, and an output signal of the second differential amplifier circuit 20 (an output signal of the differential amplifier 25) is an output signal of the signal level conversion circuit 1. In other words, the voltage of the output signal of the signal level conversion circuit 1 is $V_4$.

The following formula (3) can be obtained by substituting Formula (2) for Formula (1).

Formula 3

$$V_4 = G2 \times \{G1 \times (V_1 - V_2) - V_2\} \tag{3}$$
$$= G1 \times G2 \times V_1 - (G1 + 1) \times G2 \times V_2$$

When $-(G1+1) \times G2=1$, Formula (3) can be modified to the following formula (4), Formula 4

$$V_4 = G1 \times G2 \times V_1 + V_2 \tag{4}$$
$$= -(1 + G2) \times V_1 + V_2$$

Here, as $G2>0$, $|G1 \times G2|=|1+G2|>1$, and therefore $V_1$ being amplified and the $V_2$ without being amplified (amplified by 1) are added together. As an example, if $G1=-1.5$ and $G2=2$, $V_4=3V_1+V_2$. In other words, $V_1$ being amplified by −3 and $V_2$ without being amplified (or amplified by 1) are added together. As another example, if $G1=-1.125$ and $G2=8$, $V_4=-$ $9V_1+V_2$. In other words, $V_1$ being amplified by −9 and $V_2$ without being amplified (or amplified by 1) are added together.

For example, when $V_1$ is set as an output voltage of a sensor that detects a given physical quantity (a voltage of a sensor signal (a physical quantity signal)) $V_0$, and $V_2$ is set as a reference voltage $V_{ref}$ for the sensor signal, when $-(G1+1) \times G2=1$, $V_4 = G1 \times G2 \times V_0 + V_{ref}$. Therefore, by performing a differential operation between $V_4$ and $V_{ref}$, noise superposed on $V_{ref}$ can be completely cancelled.

In this manner, when $-(G1+1) \times G2=1$, the signal level conversion circuit in accordance with the first embodiment generates an output signal in which a first signal being amplified and a second input signal without amplified (or amplified by 1) are added together. Further, by subtracting a voltage equivalent to the voltage of the second input signal from the voltage of the output signal of the signal level conversion circuit 1 in accordance with the first embodiment, noise components corresponding to noise superposed on the second input signal can be completely cancelled. However, when $0 < -(G1+1) \times G2 < 2$, by subtracting a voltage equivalent to the voltage of the second input signal from the voltage of the output signal of the signal level conversion circuit 1 in accordance with the first embodiment, a noise component originated from noise superposed on the second input signal can be attenuated to $\{-(G1+1) \times G2-1\}$ times its original level ($\because -1 < -(G1+1) \times G2-1 < 1$).

1-2. Second Embodiment

Figure 2:
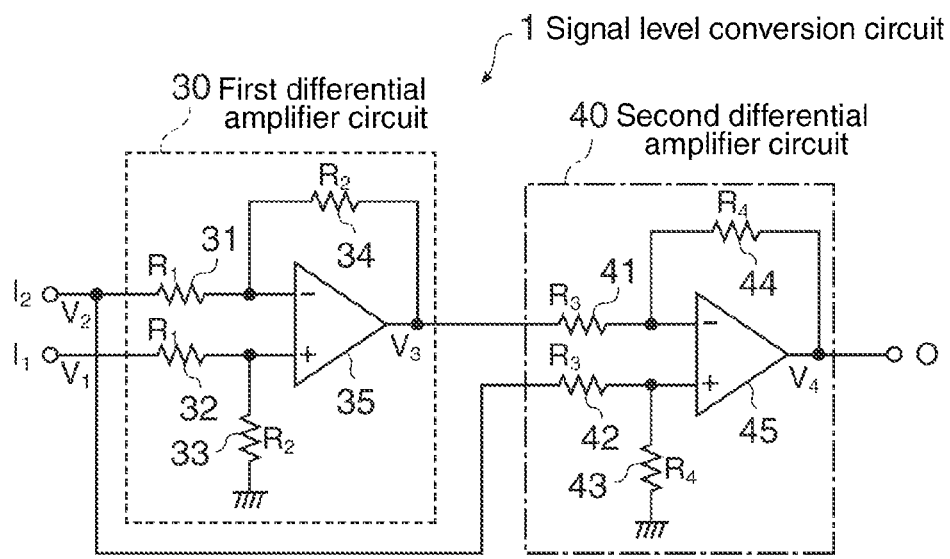
FIG. 2 is a diagram showing a signal level conversion circuit in accordance with a second embodiment of the invention.

FIG. 2 is a diagram showing a signal level conversion circuit in accordance with a second embodiment. As shown in FIG. 2, a signal level conversion circuit 1 in accordance with the second embodiment is configured with a first differential amplifier circuit 30 and a second differential amplifier circuit 40.

The first differential amplifier circuit 30 is configured with a resistance 31 having a resistance value $R_1$, a resistance 32 having the resistance value $R_1$, a resistance 33 having a resistance value $R_2$, a resistance 34 having the resistance value $R_2$, and a differential amplifier 35.

The resistance 31 has one end connected to an input terminal $I_2$ of the signal level conversion circuit 1, and another end commonly connected to one end of the resistance 34 and an inverting input terminal (− input terminal) of the differential amplifier 35. The other end of the resistance 34 is connected to an output terminal of the differential amplifier 35.

The resistance 32 has one end connected to an input terminal $I_1$ of the signal level conversion circuit 1, and another end commonly connected to one end of the resistance 33 and a non-inverting input terminal (+ input terminal) of the differential amplifier 35. Also, the other end of the resistance 33 is grounded to a ground potential.

When the voltage of a signal (first input signal) inputted in the input terminal $I_1$ is $V_1$, and the voltage of a signal (second input signal) inputted in the input terminal $I_2$ is $V_2$, the voltage of an output signal of the first differential amplifier circuit 30 (an output voltage of the differential amplifier 35) $V_3$ is given by the following formula (5).

Formula 5

$$V_3 = \frac{R_2}{R_1}(V_1 - V_2) = G1 \times (V_1 - V_2) \quad (5)$$

Here, $G1=R_2/R_1$ is a gain of the first differential amplifier circuit 30, and $G1>0$. In other words, the first differential amplifier circuit 30 is a differential amplifier circuit that non-inverts and amplifies a potential difference ($V_1-V_2$) between the first input signal and the second input signal by G1 ($>0$) and outputs the same.

The second differential amplifier circuit 40 is configured with a resistance 41 having a resistance value $R_3$, a resistance 42 having the resistance value $R_3$, a resistance 43 having a resistance value $R_4$, a resistance 44 having the resistance value $R_4$, and a differential amplifier 45.

The resistance 41 has one end connected to an output terminal of the differential amplifier 35, and another end commonly connected to one end of the resistance 44 and an inverting input terminal (− input terminal) of the differential amplifier 45. The other end of the resistance 44 is connected to an output terminal of the differential amplifier 45.

The resistance 42 has one end connected to the input terminal $I_2$ of the signal level conversion circuit 1, and another end commonly connected to one end of the resistance 43 and a non-inverting input terminal (+ input terminal) of the differential amplifier 45. The other end of the resistance 43 is grounded to a ground potential.

The voltage of an output signal of the second differential amplifier circuit 40 (an output voltage of the differential amplifier 45) $V_4$ is given by the following formula (6).

Formula 6

$$V_4 = -\frac{R_4}{R_3}(V_3 - V_2) = G2 \times (V_3 - V_2) = \quad (6)$$

Here, $G2=-R_4/R_3$ is a gain of the second differential amplifier circuit 40, and $G2>0$. In other words, the second differential amplifier circuit 40 is a differential amplifier circuit that inverts and amplifies a potential difference ($V_3-V_2$) between the output signal of the first differential amplifier circuit 30 and the second input signal by G2 ($<0$) and outputs the same.

An output terminal O of the signal level conversion circuit 1 is connected to the output terminal of the differential amplifier 45, and an output signal of the second differential amplifier circuit 40 (an output signal of the differential amplifier 45) is an output signal of the signal level conversion circuit 1. In other words, the voltage of the output signal of the signal level conversion circuit 1 is $V_4$.

The following formula (7) can be obtained by substituting Formula (6) for Formula (5).

Formula 7

$$\begin{aligned} V_4 &= G2 \times \{G1 \times (V_1 - V_2) - V_2\} \\ &= G1 \times G2 \times V_1 - (G1+1) \times G2 \times V_2 \end{aligned} \quad (7)$$

When $-(G1+1) \times G2=1$, Formula (7) can be modified into the following formula (8).

Formula 8

$$\begin{aligned} V_4 &= G1 \times G2 \times V_1 + V_2 \\ &= -\left(\frac{G1}{G1+1}\right) \times V_1 + V_2 \end{aligned} \quad (8)$$

Here, as $G1>0$, $|G1 \times G2|=|G1/(G1+1)|<1$, and therefore $V_1$ being attenuated and the $V_2$ without being amplified (amplified by 1) are added together. As an example, if $G1=3$ and G2=−0.25, $V_4$=0.75$V_1$+$V_2$. In other words, $V_1$ being attenuated to −0.75 times its original level and $V_2$ without being amplified (or amplified by 1) are added together. As another example, if G1=1.5 and G2=−0.4, $V_4$=0.6$V_1$+$V_2$. In other words, $V_1$ being attenuated to −0.6 times its original level and $V_2$ without being amplified (or amplified by 1) are added together.

For example, when $V_1$ is set as an output voltage of a sensor that detects a given physical quantity (a voltage of a sensor signal (a physical quantity signal)) $V_0$, and $V_2$ is set as a reference voltage $V_{ref}$ for the sensor signal, when −(G1+1)× G2=1, $V_4$=G1×G2×$V_0$+$V_{ref}$. Therefore, by performing a differential operation between $V_4$ and $V_{ref}$, noise superposed on $V_{ref}$ can be completely cancelled.

In this manner, when −(G1+1)×G2=1, the signal level conversion circuit in accordance with the second embodiment generates an output signal in which a first signal being attenuated and a second input signal without amplified (or amplified by 1) are added together. Further, by subtracting a voltage equivalent to the voltage of the second input signal from the voltage of the output signal of the signal level conversion circuit 1 in accordance with the second embodiment, noise components corresponding to noise superposed on the second input signal can be completely cancelled. However, when 0<−(G1+1)×G2<2, by subtracting a voltage equivalent to the voltage of the second input signal from the voltage of the output signal of the signal level conversion circuit 1 in accordance with the second embodiment, a noise component originated from noise superposed on the second input signal can be attenuated to {−(G1+1)×G2−1} times its original level (∵−1<−(G1+1)×G2−1<1).

1-3. Third Embodiment

Figure 3:
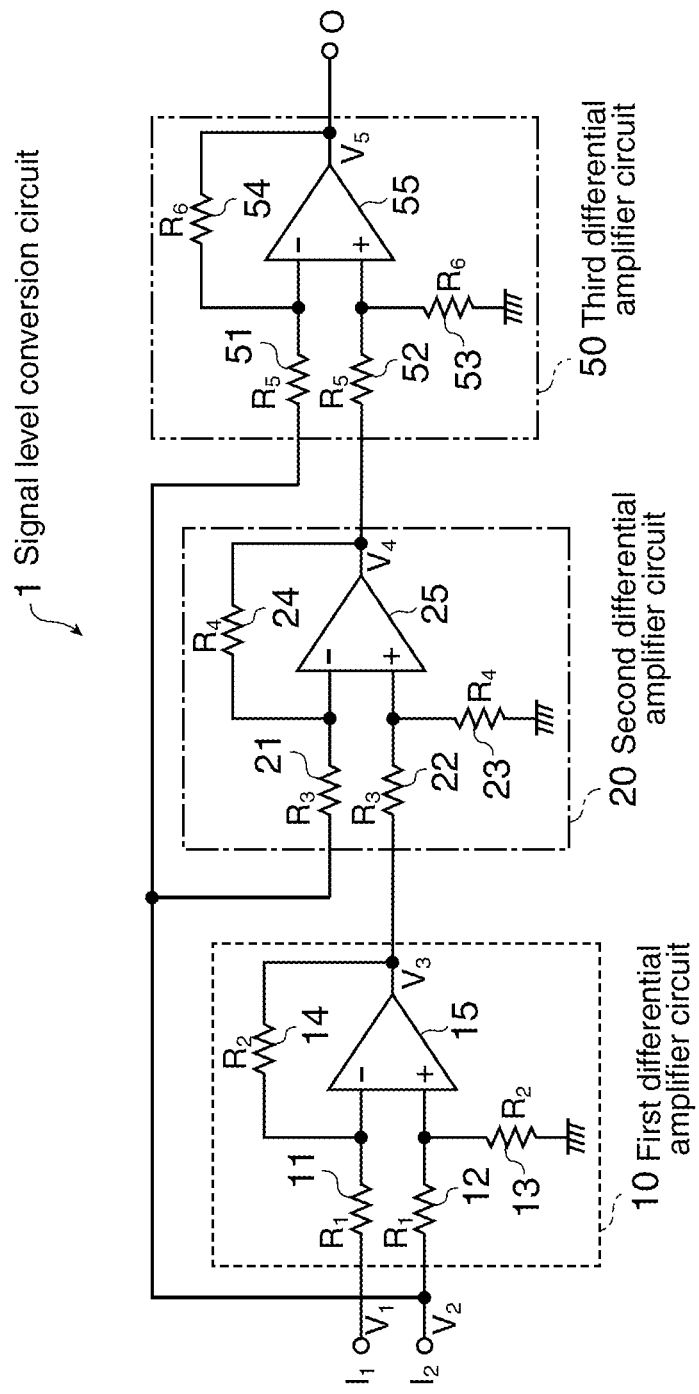
FIG. 3 is a diagram showing a signal level conversion circuit in accordance with a third embodiment of the invention.

FIG. 3 is a diagram showing a signal level conversion circuit in accordance with a third embodiment of the invention. As shown in FIG. 3, a signal level conversion circuit 1 in accordance with the third embodiment is configured with a first differential amplifier circuit 10, a second differential amplifier circuit 20, and a third differential amplifier circuit 50.

As the first differential amplifier circuit 10 and the second differential amplifier circuit 20 have the same configuration as those of the first embodiment, their components are appended with the same reference numbers, and their description will be omitted.

The third differential amplifier circuit 50 is configured with a resistance 51 having a resistance value $R_5$, a resistance 52 having the resistance value $R_5$, a resistance 53 having a resistance value $R_6$, a resistance 54 having the resistance value $R_6$, and a differential amplifier 55.

The resistance 51 has one end connected to an input terminal $I_2$ of the signal level conversion circuit 1, and another end commonly connected to one end of the resistance 54 and an inverting input terminal (− input terminal) of the differential amplifier 55. The other end of the resistance 54 is connected to an output terminal of the differential amplifier 55.

The resistance 52 has one end connected to an output terminal of the differential amplifier 25, and another end commonly connected to one end of the resistance 53 and a non-inverting input terminal (+ input terminal) of the differential amplifier 55. The other end of the resistance 53 is grounded to a ground potential.

The voltage of an output signal of the third differential amplifier circuit 50 (an output voltage of the differential amplifier 55) $V_5$ is given by the following formula (9).

Formula 9

$$V_5 = \frac{R_6}{R_5}(V_4 - V_2) = G3 \times (V_4 - V_2) = \quad (9)$$

Here, G3=$R_6$/$R_5$ is a gain of the third differential amplifier circuit 50, and G3>0. In other words, the third differential amplifier circuit 50 is a differential amplifier circuit that non-inverts and amplifies a potential difference ($V_4$−$V_2$) between the output signal of the second differential amplifier circuit 20 and the second input signal by G3 (>0) and outputs the same.

An output terminal O of the signal level conversion circuit 1 is connected to the output terminal of the differential amplifier 55, and an output signal of the third differential amplifier circuit 50 (an output signal of the differential amplifier 55) is an output signal of the signal level conversion circuit 1. In other words, the voltage of the output signal of the signal level conversion circuit 1 is $V_5$.

The following formula (10) can be obtained by substituting Formula (3) for Formula (9).

Formula 10

$$V_5 = G3 \times (G1 \times G2 \times V_1 - (G1 + 1) \times G2 \times V_2 - V_2) \quad (10)$$
$$= G1 \times G2 \times G3 \times V_1 - \{(G1 + 1) \times G2 + 1\} \times G3 \times V_2$$

When −(G1+1)×G2=1, Formula (10) can be modified into the following formula (11).

Formula 11

$$V_5 = G1 \cdot G2 \cdot G3 \cdot V_1 \quad (11)$$

In other words, in the output signal of the signal level conversion circuit 1, noise components corresponding to noise superposed on the second input signal can be completely cancelled. Further, by adjusting the gain G3 of the third differential amplifier circuit 50, the total gain G1×G2× G3 can be set to a desired value.

For example, when $V_1$ is an output voltage of a sensor that detects a given physical quantity (a voltage of a sensor signal (a physical quantity signal)) $V_0$, and $V_2$ is a reference voltage $V_{ref}$ for the sensor signal, when −(G1+1)×G2=1, $V_5$=G1× G2×G3×$V_0$. Therefore, noise superposed on $V_{ref}$ can be completely cancelled.

In this manner, when −(G1+1)×G2=1, the signal level conversion circuit in accordance with the third embodiment amplifies or attenuates the first signal G1×G2×G3 times, and noise components corresponding to noise superposed on the second input signal can be completely cancelled. However, when 0<−(G1+1)×G2<2, a noise component originated from noise superposed on the second input signal can be attenuated to {−(G1+1)×G2−1} times its original level (∵−1<−(G1+1)× G2−1<1).

1-4. Fourth Embodiment

Figure 4:
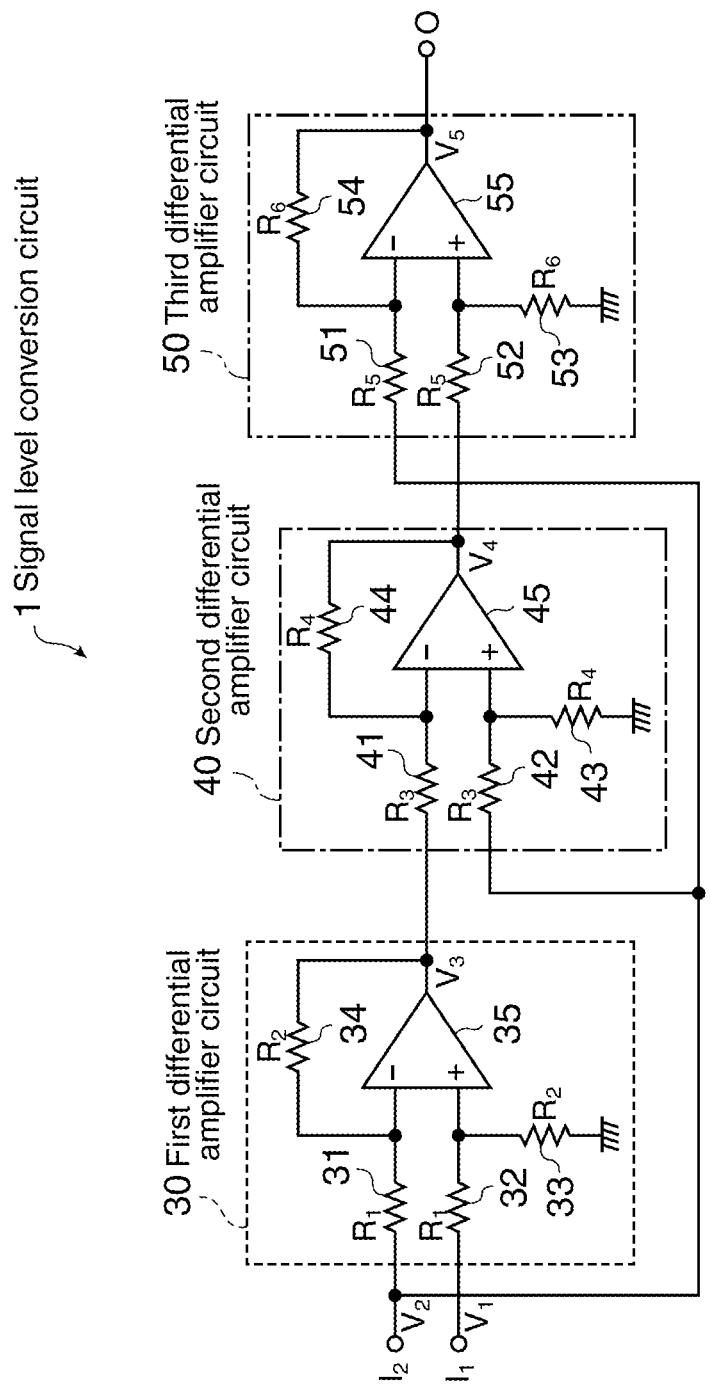
FIG. 4 is a diagram showing a signal level conversion circuit in accordance with a fourth embodiment of the invention.

FIG. 4 is a diagram showing a signal level conversion circuit in accordance with a fourth embodiment of the invention. As shown in FIG. 4, a signal level conversion circuit 1 in accordance with the fourth embodiment is configured with a first differential amplifier circuit 30, a second differential amplifier circuit 40, and a third differential amplifier circuit 50.

As the first differential amplifier circuit 30 and the second differential amplifier circuit 40 have the same configuration as those shown in FIG. 2, their components are appended with the same reference numbers, and their description will be omitted. Also, as the third differential amplifier circuit 50 has the same configuration as that shown in FIG. 3, its components are appended with the same reference numbers, and their description will be omitted.

The voltage $V_5$ of the output signal of the signal level conversion circuit 1 is given by the formula (10), and can be modified into the formula (11) when $-(G1+1) \times G2=1$.

Therefore, like the third embodiment, when $-(G1+1) \times G2=1$, the signal level conversion circuit in accordance with the fourth embodiment amplifies or attenuates the first signal $G1 \times G2 \times G3$ times, and noise components corresponding to noise superposed on the second input signal can be completely cancelled. However, when $0<-(G1+1) \times G2<2$, a noise component originated from noise superposed on the second input signal can be attenuated to $\{-(G1+1) \times G2-1\}$ times its original level $(\because -1<-(G1+1) \times G2-1<1)$.

2. Physical Quantity Detection Device

A physical quantity detection device in accordance with an embodiment of the invention includes a sensor element that detects a given physical quantity, and generates a physical quantity signal with a signal level according to the physical quantity based on a signal generated by the sensor element. The physical quantity detection device in accordance with the present embodiment is applicable for detection of any one of various physical quantities, such as, for example, angular velocity, angular acceleration, acceleration, force, temperature, magnetic, and the like.

Figure 5:
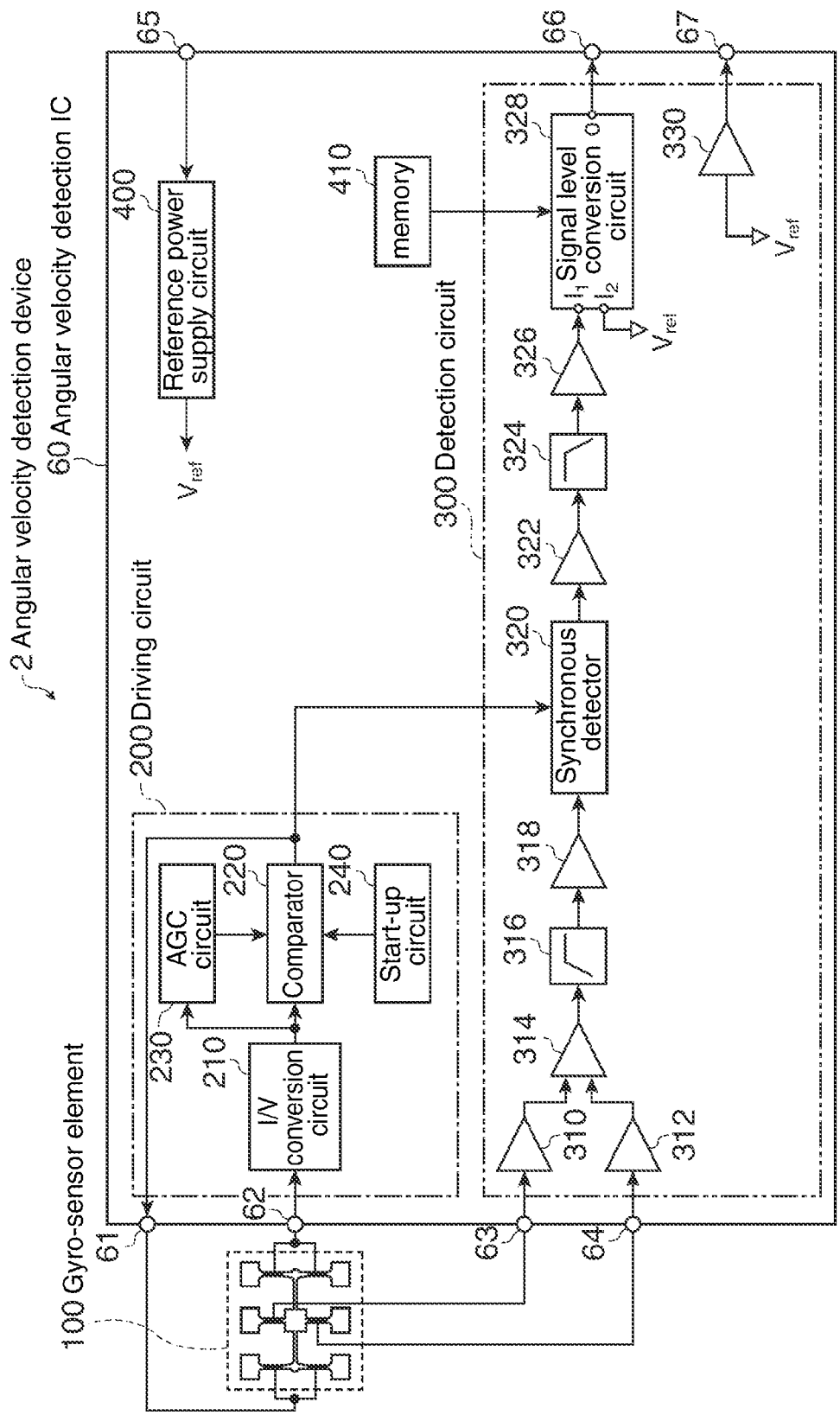
FIG. 5 is a diagram showing an exemplary configuration of an angular velocity detection device that is an example of a physical quantity detection device.

FIG. 5 is a diagram showing an exemplary configuration of an angular velocity detection device, which is an example of the physical quantity detection device in accordance with the present embodiment.

An angular velocity detection device 2 in accordance with the present embodiment is configured with a gyro-sensor element 100 and an angular velocity detector IC 60.

The gyro-sensor element 100 (an example of the sensor element) is configured with a vibrator having driver electrodes and detection electrodes disposed thereon and sealed in an unshown package. Generally, the air-tightness within the package is maintained in order to reduce the impedance of the vibrator to increase the oscillation efficiency as much as possible.

The vibrator of the gyro-sensor element 100 may be made of piezoelectric single crystal, such as, for example, crystal quartz ($SiO_2$), lithium tantalate ($LiTaO_3$), lithium niobate ($LiNbO_3$) and the like, or piezoelectric material such as piezoelectric ceramics such as lead zirconate titanate (PZT) and the like, or may have a structure in which a piezoelectric thin film of zinc oxide (ZnO), aluminum nitride (AlN) or the like sandwiched between driving electrodes is arranged on a portion of a silicon semiconductor surface. The excitation device for driving vibration and the detection device for detection vibration of the gyro sensor element may be of the type using piezoelectric effect but also of the electrostatic type using Coulomb force.

In accordance with the present embodiment, the gyro-sensor element 100 may be configured with a so-called double T-shaped vibrator having two T-shaped driving vibration arms. The vibrator of the gyro-sensor element 100 may be of a tuning fork type or a tuning bar type in a triangular prism shape, a quadrangular prism shape, a columnar pillar shape or the like. The vibrator may be of a type having a silicon semiconductor substrate processed into a comb-teeth shape.

Figure 6:
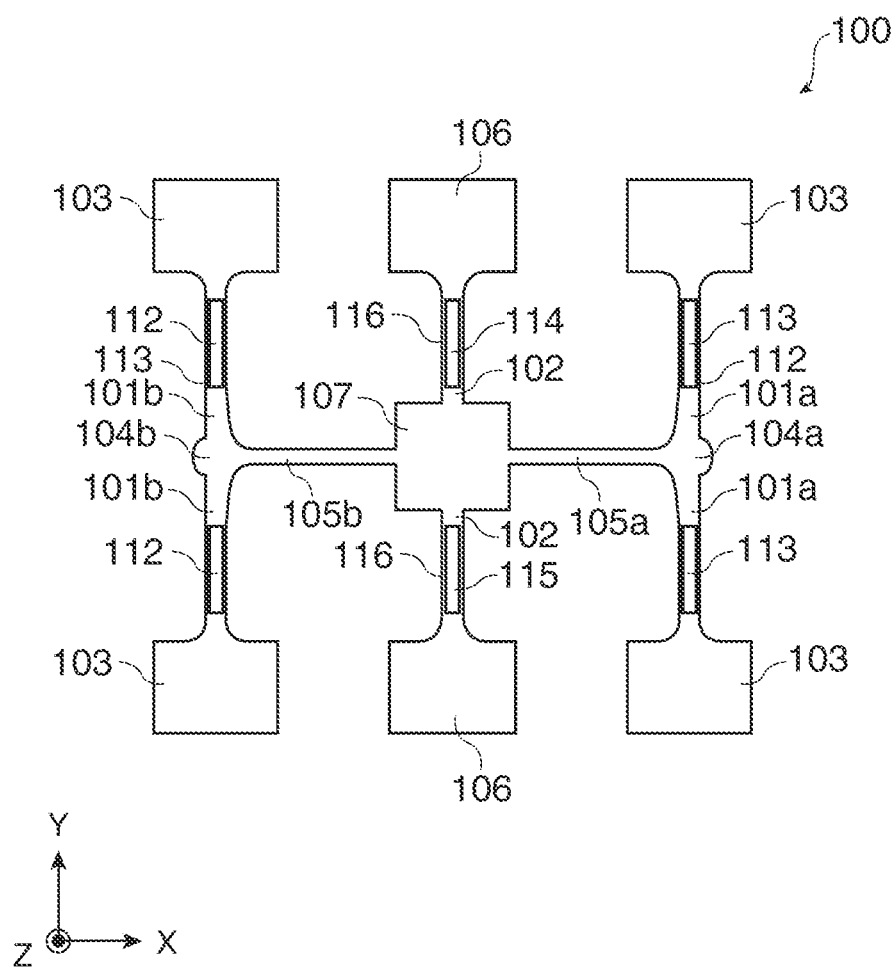
FIG. 6 is a plan view of an oscillator of a gyro-sensor element.

FIG. 6 is a plan view of the vibrator of the gyro-sensor element 100 in accordance with the present embodiment.

The gyro-sensor element 100 of the present embodiment has a double T-shaped vibrator formed from a Z-cut crystal quartz substrate. The vibrator made of crystal quartz has extremely small variations in its oscillation frequency against temperature changes, and thus has an advantage in that the angular velocity detection accuracy can be made higher. It is noted that an X-axis, a Y-axis and a Z-axis shown in FIG. 6 are the axes of quartz crystal.

As shown in FIG. 6, the vibrator of the gyro-sensor element 100 includes two driving base portions 104a and 104b having driving vibration arms 101a and 101b extending respectively from the driving base portions 104a and 104b in the +Y axis direction and the −Y axis direction. Driving electrodes 112 and 113 are formed respectively on the side surface and the upper surface of the driving vibration arms 101a, and driving electrodes 113 and 112 are formed respectively on the side surface and the upper surface of the driving vibration arms 101b. The driving electrodes 112 and 113 are connected respectively to a driving circuit 200 through an external output terminal 61 and an external input terminal 62 of the angular velocity detection IC 60 shown in FIG. 5.

The driving base portions 104a and 104b are connected respectively to a rectangular detection base portion 107 through coupling arms 105a and 105b extending in the −X axis direction and the +X axis direction, respectively.

Detection vibration arms 102 extend from the detection base portion 107 in the +Y axis direction and the −Y axis direction, respectively. Detection electrodes 114 and 115 are formed on the upper surface of the detection vibration arms 102, respectively, and common electrodes 116 are formed on the side surface of the detection vibration arms 102, respectively. The detection electrodes 114 and 115 are connected respectively to a detection circuit 300 through external input terminals 63 and 64 of the angular velocity detection IC 60 shown in FIG. 5. Also, the common electrodes 116 are grounded.

When an AC voltage is applied as a driving signal between the driving electrodes 112 and the driving electrodes 113 of the driving vibration arms 101a and 101b, the driving vibration arms 101a and 101b have flexural vibration (excitation vibration) in a manner that mutual approach and separation of the tips of the two driving vibration arms 101a and 101b are repeated as indicated by arrows B due to inverse-piezoelectric effect.

Figure 8:
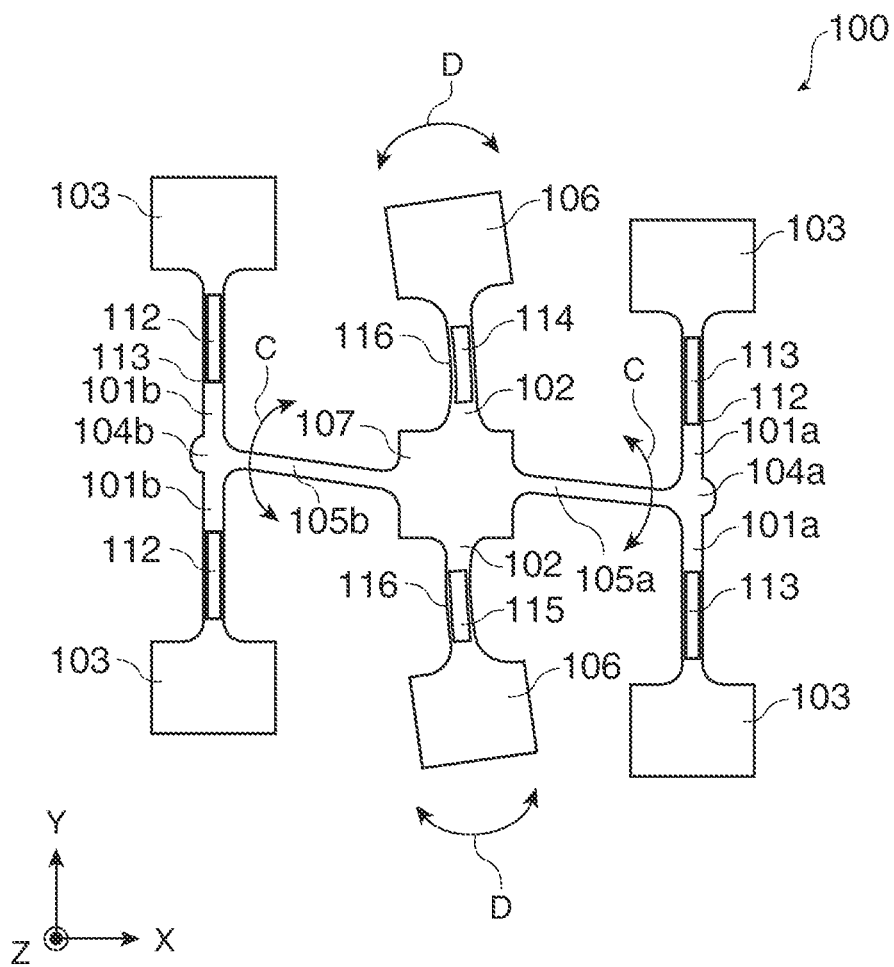
FIG. 8 is a diagram for describing an operation of the gyro-sensor element.

If an angular velocity is applied about the Z-axis as a rotation axis to the vibrator of the gyro-sensor element 100 in this state, the driving vibration arms 101a and 101b are subjected to a Coliolis force in a direction perpendicular to both of the direction of flexural vibration indicated by the arrows B and the Z-axis. As a result, as shown in FIG. 8, the coupling arms 105a and 105b vibrate as indicated by arrows C. Then, the detection vibration arms 102 have flexural vibration as indicated by arrows D, linked with the vibration of the coupling arms 105a and 105b (as indicated by arrows C). The flexural vibration of the detection vibration arms 102 and the flexural vibration (excitation vibration) of the driving vibration arms 101a and 101b associated with the Coliolis force are shifted in phase by 90 degrees.

When the two driving vibration arms 101a and 101b are mutually equal in the magnitude of vibration energy or the magnitude of amplitude of vibration generated when the driving vibration arms 101a and 101b have flexural vibration (excitation vibration), the vibration energy is balanced between the driving vibration arms 101a and 101b, such that the detection vibration arms 102 do not flexurally vibrate in a state in which no angular velocity is applied to the gyro-sensor element 100. However, when the vibration energy becomes imbalance between the driving vibration arms 101a and 101b, flexural vibration is generated in the detection vibration arms 102 even in a state in which no angular velocity is applied to the gyro-sensor element 100. Such flexural vibration is called leakage vibration, which is flexural vibration indicated by arrows D, like the vibration based on the Coliolis force, but in the same phase as that of the driving signal.

Then, AC charges based on these flexural vibrations are generated by the piezoelectric effect in the detection electrodes 114 and 115 on the detection vibration arms 102. Here, the AC charges generated based on a Coliolis force change according to the magnitude of the Coliolis force (in other words, the magnitude of the angular velocity applied to the gyro-sensor element 100). On the other hand, AC charge generated based on leakage vibration is constant irrespective of the magnitude of angular velocity applied to the gyro-sensor element 100.

It is noted that a rectangular weight portion 103 wider than each of the driving vibration arms 101*a* and 101*b* is formed at the tip of each of the driving vibration arms 101*a* and 101*b*. By forming the weight portion 103 at the tip of each of the driving vibration arms 101*a* and 101*b*, a greater Coliolis force can be generated, and a desired resonance frequency can be obtained with relatively short vibration arms. Similarly, a weight portion 106 wider than each of the detection vibration arms 102 is formed at the tip of each of the detection vibration arms 102. By forming the weight portion 106 at the tip of each of the detection vibration arms 102, greater AC charges can be induced at the detection electrodes 114 and 115.

In this manner, the gyro-sensor element 100 outputs AC charges based on the Coliolis force (angular velocity components) about the Z-axis as a detection axis, and AC charges based on leakage vibration (vibration leakage components) in the excitation vibration through the detection electrodes 114 and 115.

Referring back to FIG. 5, the angular velocity detection IC 60 is configured with a driving circuit 200, a detection circuit 300, a reference power supply circuit 400 and a memory 410.

The reference power supply circuit 400 generates a reference voltage $V_{ref}$ from a power supply voltage supplied through a power supply input terminal 65.

The driving circuit 200 is configured with a I/V conversion circuit (a current-voltage conversion circuit) 210, a comparator 220, AGC (Automatic Gain Control) circuit 230 and a start-up circuit 240.

A drive current that flows to the vibrator of the gyro-sensor element 100 is converted to an AC voltage signal by the I/V conversion circuit 210 with the reference voltage $V_{ref}$ as the reference.

The AC voltage signal outputted from the I/V conversion circuit 210 is inputted in the comparator 220 and the AGC circuit 230. The comparator 220 compares the voltage of the inputted AC voltage signal with the reference voltage $V_{ref}$, and outputs a binary signal (a rectangular wave voltage signal).

The AGC circuit 230 changes the amplitude of the binary signal outputted from the comparator 220 according to the amplitude of the AC voltage signal outputted from the I/V conversion circuit 210, and controls so as to keep the drive current constant.

The binary signal outputted from the comparator 220 is supplied to the driving electrodes 112 of the vibrator of the gyro-sensor element 100 through the external output terminal 61.

Figure 7:
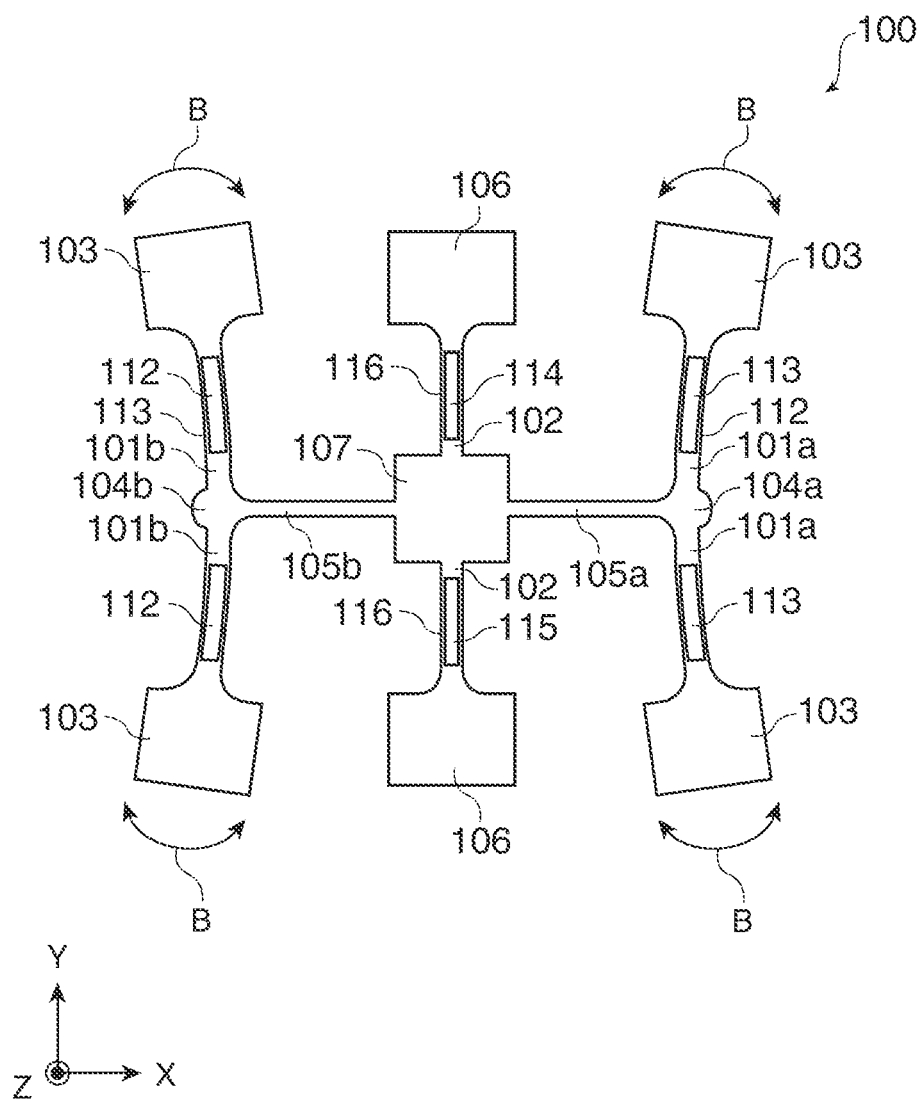
FIG. 7 is a diagram for describing an operation of the gyro-sensor element.

In this manner, the gyro-sensor element 100 continuously excites a predetermined driving vibration shown in FIG. 7 by an oscillation loop circulating through the driving circuit 200. Also, by maintaining the driving current at constant, the driving vibration arms 101*a* and 101*b* of the gyro-sensor element 100 can obtain a constant vibration velocity. Therefore, the vibration velocity that is a source of generation of a Coliolis force becomes constant, whereby the sensitivity can be stabilized better.

The start-up circuit 240 includes an oscillation source for causing the gyro-sensor element 100 to have flexural vibration at the time of power-on, and is separated from the oscillation loop when the amplitude of the AC voltage signal outputted from the I/V conversion circuit 210 exceeds a predetermined threshold value.

The detection circuit 300 is configured with charge amplifiers 310 and 312, a differential amplifier 314, a high-pass filter 316, an amplifier 318, a synchronous detector 320, an amplifier 322, a low-pass filter 324, an amplifier 326, a signal level conversion circuit 328, and amplifier 330.

AC charge containing an angular velocity component and a vibration leakage component is inputted in the charge amplifier 310 from the detection electrode 114 on the vibrator of the gyro-sensor element 100 through the external input terminal 63. Similarly, AC charge containing an angular velocity component and a vibration leakage component is inputted in the charge amplifier 312 from the detection electrode 115 on the vibrator of the gyro-sensor element 100 through the external input terminal 64. The charge amplifiers 310 and 312 convert the respectively inputted AC charges into AC voltage signals. The output signal of the charge amplifier 310 and the output signal of the charge amplifier 312 are mutually in inverse phase (shifted in phase by 180 degrees).

The differential amplifier 314 differentially amplifies the output signal of the charge amplifier 310 and the output signal of the charge amplifier 312. Components in same phase are cancelled, and components in inverse phase are amplified by addition.

The high-pass filter 316 cancels DC components contained in the output signal of the differential amplifier 314.

The amplifier 318 amplifies the output signal of the high-pass filter 316, and outputs an AC voltage signal with the reference voltage $V_{ref}$ as the reference.

The synchronous detector 320 performs synchronous detection of the output signal of the amplifier 318 with the binary signal outputted from the comparator 220. The synchronous detector 320 can be configured as a switching circuit that selects the output signal of the amplifier 318 as is when the voltage level of the binary signal is higher than the reference voltage $V_{ref}$, and selects an inverted signal of the output signal of the amplifier 318 inverted with respect to the reference voltage $V_{ref}$ when the voltage level of the binary signal is lower than the reference voltage $V_{ref}$.

The output signal of the amplifier 318 contains an angular velocity component and a vibration leakage component. The angular velocity component is in the same phase with the binary signal outputted from the comparator 220, but the vibration leakage component is in inverse phase with the binary signal. Therefore, the angular velocity component is coherently detected by the synchronous detector 320, but the vibration leakage component is not detected.

The amplifier 322 amplifies or attenuates the output signal of the synchronous detector 320 to output a signal with a desired voltage level. The low-pass filter 324 removes high frequency components contained in the output signal of the amplifier 322, and extracts signals in a frequency range decided by the specification.

The output signal of the low-pass filter 324 is amplified or attenuated to a signal with a desired voltage level by the amplifier 326. The output signal of the amplifier 326 is a signal with a voltage level according to the angular velocity with the reference voltage $V_{ref}$ as the reference, in other words, an angular velocity signal (an example of a physical quantity signal).

The signal level conversion circuit 328 is any one of the signal level conversion circuits in accordance with the embodiments described in conjunction with FIGS. 1 through 4, receives the output signal (the angular velocity signal) of the amplifier 326 at the input terminal $I_1$ and the reference voltage $V_{ref}$ at the input terminal $I_2$, and outputs a signal that is differentially amplified through the output terminal O. The gain of the signal level conversion circuit 328 is decided according to gain adjustment data set in advance in the memory 410. The output signal of the signal level conversion circuit 328 is outputted externally through the external output terminal 66.

The reference voltage $V_{ref}$ is inputted in the amplifier 330 (a voltage follower), and outputted to the outside through the external output terminal 67.

In this manner, by incorporating the signal level conversion circuit in accordance with any one of the embodiments, a physical quantity detection device that outputs a physical quantity signal with low noise can be realized.

3. Electronic Apparatus

Figure 9:
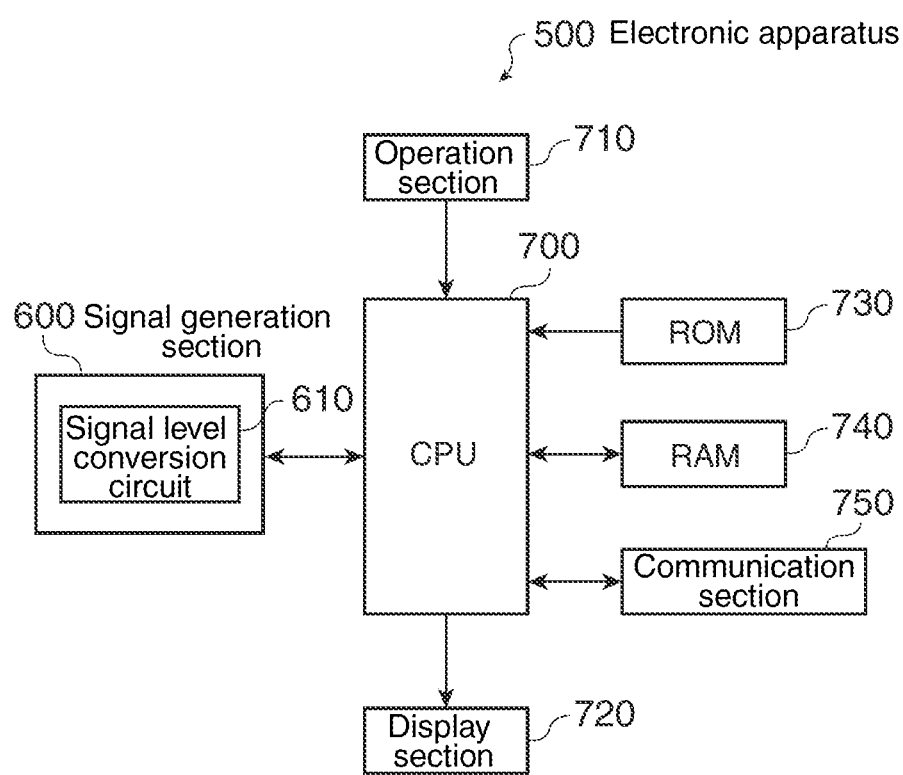
FIG. 9 is a functional block diagram of an electronic apparatus.

FIG. 9 is a functional block diagram showing an exemplary configuration of an electronic apparatus in accordance with an embodiment of the invention. An electronic apparatus 500 in accordance with the present embodiment is configured with a signal generation section 600, a CPU 700, an operation section 710, a display section 720, a ROM (Read Only Memory) 730, a RAM (Random Access Memory) 740, and a communication section 750. It is noted that the electronic apparatus in accordance with the present embodiment may be configured with a portion of the constituting elements (the sections) shown in FIG. 9 omitted, or with other constituting elements added.

The signal generation section 600 includes a signal level conversion circuit 610, generates a given signal in response to the control of the CPU 700 and outputs the signal to the CPU 700.

The CPU 700 performs various kinds of calculation processing and control processing according to programs stored in the ROM 730. More specifically, the CPU 700 controls the signal generation section 600, and executes various kinds of calculation processing with signals generated by and received from the signal generation section 600. Also, the CPU 700 performs various kinds of processing according to operation signals from the operation section 710, processing to transmit display signals for displaying various kinds of information on the display section 720, processing to control the communication section 750 for performing data communications with the outside, and the like.

The operation section 710 may be formed from with an input device configured with operation keys, button switches and the like, and outputs operation signals in response to operation by the user to the CPU 700.

The display section 720 is a display device configured with an LCD (Liquid Crystal Display) and the like, and displays various kinds of information based on display signals received from the CPU 700.

The ROM 730 stores programs for the CPU 700 to execute various kinds of operation processing and control processing, and various kinds of programs and data for realizing predetermined functions.

The RAM 740 is used as a work area for the CPU 700, and temporarily stores programs and data readout from the ROM 730, data inputted from the operation section 710, operation results executed by the CPU 700 according to various kinds of programs, and the like.

The communication section 750 performs various kinds of controls for establishing data communications between the CPU 700 and external devices.

By incorporating the signal level conversion circuit in accordance with any one of the embodiments described above as the signal level conversion circuit 610 in the electronic apparatus 500, processing with higher accuracy can be realized. In particular, by incorporating the signal level conversion circuit in accordance with the third embodiment or the fourth embodiment, the differential operation in a succeeding stage of the physical quantity detection device may be made unnecessary to be executed, and therefore the cost of the entire system may be reduced.

It is noted that the electronic apparatus 500 can be realized as any one of various kinds of electronic apparatuses, such as, for example, a skidding prevention device for vehicles, a rollover detection device for vehicles, a cellular phone, a navigation device, a pointing device such as a mouse or the like, a digital camera, a game controller and the like.

It is noted that the invention is not limited to the embodiments described above, and many changes can be made and implemented within the range of the subject matter of the invention.

The invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

The entire disclosure of Japanese Patent Application No. 2010-240736, filed Oct. 27, 2010 is expressly incorporated by reference herein.

What is claimed is:

1. A physical quantity detection device comprising:
    a signal level conversion circuit comprising:
        a first differential amplifier circuit that multiplies a potential difference between a first input signal and a second input signal by G1 thereby providing an output signal; and
        a second differential amplifier circuit that multiplies a potential difference between the output signal of the first differential amplifier circuit and the second input signal by G2 thereby providing an output signal, where $G1 \times G2 < 0$ and $0 < -(G1+1) \times G2 < 2$;
    a sensor element that detects a physical quantity; and
    a physical quantity signal generation section that generates a physical quantity signal having a signal level according to the physical quantity based on a signal generated by the sensor element,
    the physical quantity signal and a reference voltage signal being supplied to the signal level conversion circuit as the first input signal and the second input signal, respectively.

2. The physical quantity detection device of claim 1, wherein $G1 < 0$ and $G2 > 0$.

3. The physical quantity detection device of claim 1, wherein $G1 > 0$ and $G2 < 0$.

4. The physical quantity detection device of claim 1, wherein $-(G1+1) \times G2 = 1$.

5. A signal level conversion circuit comprising:
- a first differential amplifier circuit that multiplies a potential difference between a first input signal and a second input signal by G1 thereby providing an output signal; and
- a second differential amplifier circuit that multiplies a potential difference between the output signal of the first differential amplifier circuit and the second input signal G2 thereby providing an output signal, where $G1 \times G2 < 0$ and $0 < -(G1+1) \times G2 < 2$,
- wherein the second input signal is a reference voltage signal corresponding to a reference voltage of the first input signal.

6. The physical quantity detection device of claim 1 further comprising a third differential amplifier circuit that amplifies or attenuates a potential difference between the output signal of the second differential amplifier circuit and the second input signal.

7. An electronic apparatus comprising the physical quantity detection device detection device of claim 1.

* * * * *